(12) United States Patent
Streett et al.

(10) Patent No.: US 10,317,448 B2
(45) Date of Patent: Jun. 11, 2019

(54) HUMAN SENSING USING ELECTRIC FIELDS, AND ASSOCIATED SYSTEMS AND METHODS

(71) Applicant: SWIFT ENGINEERING, INC., San Clemente, CA (US)

(72) Inventors: Andrew Streett, San Clemente, CA (US); Bryan Brown, Portland, OR (US)

(73) Assignee: SWIFT ENGINEERING, INC., San Clemente, CA (US)

( * ) Notice: Subject to any disclaimer, the term of this patent is extended or adjusted under 35 U.S.C. 154(b) by 0 days.

(21) Appl. No.: 15/601,952

(22) Filed: May 22, 2017

(65) Prior Publication Data

US 2018/0335460 A1    Nov. 22, 2018

(51) Int. Cl.
  *G01R 29/12* (2006.01)
  *G01V 3/08* (2006.01)
  *B60R 21/015* (2006.01)

(52) U.S. Cl.
  CPC ........ *G01R 29/12* (2013.01); *B60R 21/01532* (2014.10); *G01V 3/088* (2013.01)

(58) Field of Classification Search
  None
  See application file for complete search history.

(56) References Cited

U.S. PATENT DOCUMENTS

| | | | | |
|---|---|---|---|---|
| 5,166,679 A * | 11/1992 | Vranish | ........... | B25J 13/086 |
| | | | | 324/687 |
| 7,330,032 B2 * | 2/2008 | Donnangelo | ........ | A61B 5/0536 |
| | | | | 324/452 |
| 7,397,351 B1 * | 7/2008 | Rubin | ........... | B60Q 9/008 |
| | | | | 324/457 |
| 2005/0122118 A1 * | 6/2005 | Zank | ........... | G01D 9/005 |
| | | | | 324/457 |
| 2005/0167588 A1 * | 8/2005 | Donnangelo | ........ | A61B 5/0536 |
| | | | | 250/307 |
| 2006/0261818 A1 * | 11/2006 | Zank | ........... | G01V 3/088 |
| | | | | 324/457 |
| 2008/0122458 A1 * | 5/2008 | Lenz | ........... | H03K 17/955 |
| | | | | 324/687 |

(Continued)

OTHER PUBLICATIONS https://www.nxp.com/docs/en/data-sheet/MC33794.pdf; Nov. 2006.*

(Continued)

*Primary Examiner* — Jermele M Hollington
*Assistant Examiner* — Suresh K Rajaputra
(74) *Attorney, Agent, or Firm* — Perkins Coie LLP

(57) ABSTRACT

A system for detecting a living being using electric fields may include sensors configured to generate and receive an electric field. The system may include at least one amplifier connected to at least one electrode of a sensor, a controller to operate the sensors, and a processor connected to the controller. The processor may output a signal representative of the presence or absence of a living being present in the electric fields or representative of a distance between the sensor and the living being. The sensors may be attached to a rigid or flexible substrate forming part of a skin that can be attached to a robot, a vehicle, or another moving or autonomous device to sense the presence of a living being near the device. The device may be configured to stop moving or to move to avoid the living being in the electric field.

17 Claims, 10 Drawing Sheets

(56) References Cited

U.S. PATENT DOCUMENTS

Figure 1:
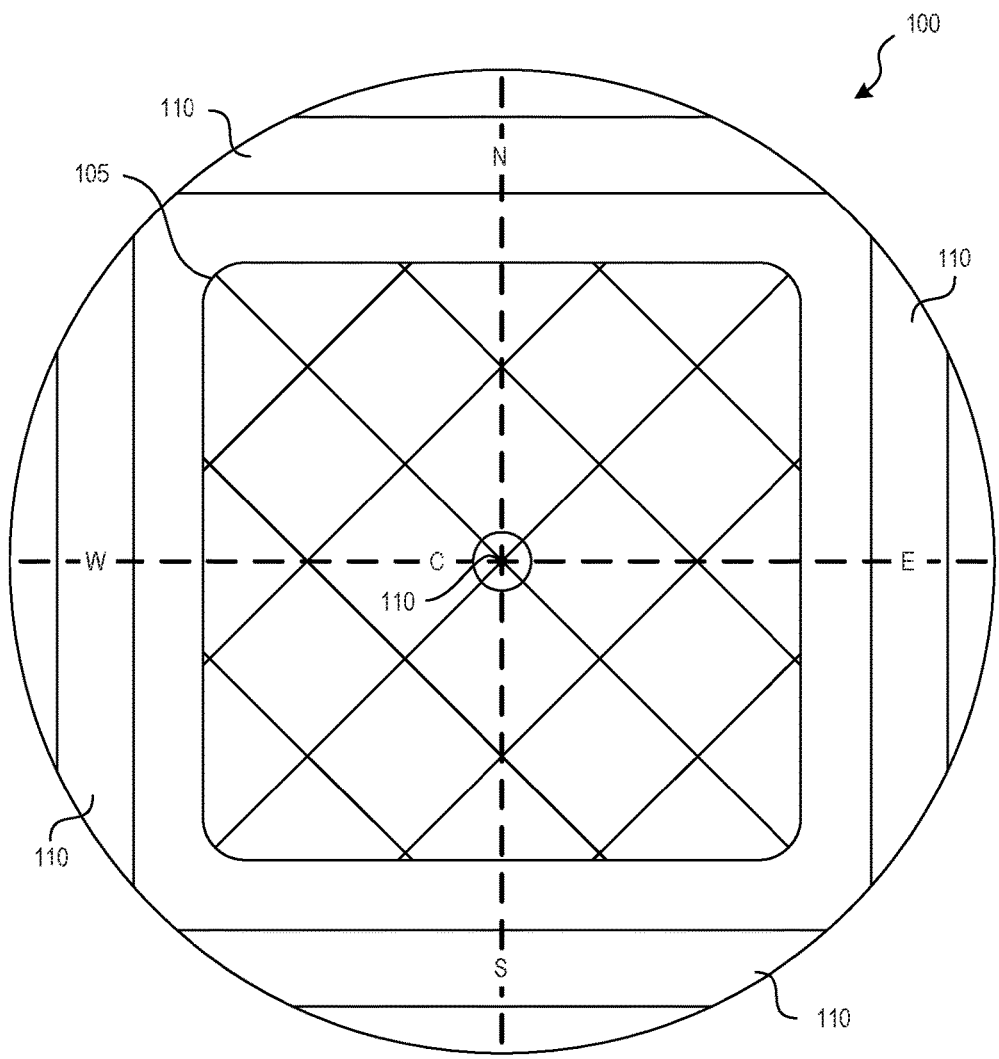

| | | | | |
|---|---|---|---|---|
| 2009/0295366 A1* | 12/2009 | Cehelnik | ............... | G06F 3/017 324/76.11 |
| 2010/0253319 A1* | 10/2010 | Cehelnik | ............... | G06F 3/017 324/72 |
| 2012/0245873 A1* | 9/2012 | Donnangelo | .......... | G01N 22/00 702/65 |
| 2015/0268729 A1* | 9/2015 | Cehelnk | ............... | G06F 3/017 340/870.3 |
| 2016/0103500 A1* | 4/2016 | Hussey | ............... | G06F 3/046 345/173 |

OTHER PUBLICATIONS http://www.ti.com/lit/ds/symlink/tlc2272.pdf; Feb. 1997.*

Cheung, Ed, "Sensor-Based Motion Planning of Robotic Arm Manipulators", http://www.edcheung.com/job/sbr/sbr.html, exact publication date unknown (web page last visited Jun. 13, 2017).

Dockterman, Eliana, "Robot Kills Man at Volkswagen Plant", http://time.com/3499181/robot-kills-man-volkswagen-plant/, Jul. 1, 2015.

Ford Europe, Car Workers and Robots Work Hand-in-Hand, https://www.youtube.com/watch?v=l8nMKH3y_1l, Jul. 14, 2016.

Koenigsegg Sweden, "Koenigsegg Regera 'Autoskin'", http://www.youtube.com/watch?v=bijcZGGjXbM, Nov. 13, 2015.

Kravets, David, "Jan. 25, 1979: Robot Kills Human", Wired, https://www.wired.com/2010/01/0125robot-kills-worker/, Jan. 25, 2010.

Lumelsky et al., "Sensitive Skin", IEEE Sensors Journal 1(1):41-51 (2001).

Maclain, Jennifer, "La Puente woman crushed by robot at McDonald's supplier in Industry" http://www.pasadenastarnews.com/article/ZZ/20090721/NEWS/907219894, Jul. 21, 2009.

Microchip Technology, Inc., "GestIC Technology—3D Gestures—Overview", http://www.microchip.com/design-centers/touch-input-sensing/gestic-technology/overview, exact publication date unknown (web page last visited May 22, 2017).

Microchip Technology, Inc., "MGC3130 Hillstar Development Kit User's Guide", DS40001721A, available at http://ww1.microchip.com/downloads/en/DeviceDoc/40001721A.pdf, 2013.

Microchip Technology, Inc., "MGC3130 Hillstar Development Kit User's Guide", DS40001721B, available at http://ww1.microchip.com/downloads/en/DeviceDoc/40001721B.pdf, 2013-2016.

NASA "2015 NASA Technology Roadmaps, Section TA 4: Robotics and Autonomous Systems", https://www.nasa.gov/sites/default/files/atoms/files/2015_nasa_technology_roadmaps_ta_4_robotics_and_autonomous_systems_final.pdf, exact publication date unknown (web page last visited Jun. 13, 2017).

National Institute for Occupational Safety and Health, "Fatal Accident Summary Report: Die Cast Operator Pinned by Robot", https://www.cdc.gov/niosh/face/in-house/full8420.html, exact publication date unknown (web page last visited Jun. 13, 2017).

Paradiso et al., "Sensate Media—Multimodal Electronic Skins as Dense Sensor Networks", BT Technology Journal 22(4):32-44 (2004).

Robotics Technology Consortium et al., "A Roadmap for U.S. Robotics—From Internet to Robotics (2013 Edition)," https://robotics-vo.us/sites/default/files/2013%20Robotics%20Roadmap-rs.pdf, exact publication date unknown (web page last visited May 22, 2017).

Sauerbrunn et al., "Thermal imaging using polymernanocomposite temperature sensors", Physica Status Solidi A 212(10):2239-45 (2015).

Someya et al., A large-area, flexible pressure sensor matrix with organic field-effect transistors for artificial skin applications, PNAS 101(27):9966-70 (2004), available at https://www.ncbi.nlm.nih.gov/pmc/articles/PMC454198/pdf/1019966.pdf.

Stiehl & Breazeal, "A 'Sensitive Skin' for Robotic Companions Featuring Temperature, Force, and Electric Field Sensors", IEEE/RSJ International Conference on Intelligent Robots and Systems, 1952-1959 (2006), available at https://pdfs.semanticscholar.org/3654/d2cb28236840de431061eb8afe94e990479c.pdf.

Torchinsky, Jason, "Did Tesla Quietly Remove a Safety Feature From the Model X's Falcon Doors?", http://jalopnik.com/did-tesla-quietly-remove-a-safety-feature-from-the-mode-1786000681, Aug. 31, 2016.

Whatis.com, "Electric Field Sensing (EF sensing)", http://whatis.techtarget.com/definition/electric-field-sensing-EFsensing, exact publication date unknown (web page last visited Jun. 13, 2017).

Wikipedia, "Autonomous Car", https://en.wikipedia.org/wiki/Autonomous_car, exact publication date unknown (web page last visited May 22, 2017).

USPTO, Search Report and Written Opinion for PCT/US18/33400, dated Jun. 22, 2018.

* cited by examiner

HUMAN SENSING USING ELECTRIC FIELDS, AND ASSOCIATED SYSTEMS AND METHODS

BACKGROUND

As robotics and autonomous technology becomes more prevalent in society, this technology inevitably will interact with humans such as operators, maintenance workers, and bystanders. For example, robots in factories and other locations may work near or in cooperation with humans. These robots may be very fast and powerful relative to their human counterparts, which raises the risk of human injury or death. As a specific example, a robotic arm on a factory floor may have the strength to move heavy parts. If a worker or bystander is trapped near such a robotic arm during use or a malfunction, the person could be harmed. As another example, robots or humanoids may become part of future space missions in which they will work alongside people. These robots or humanoids will need to include safety features to keep their human counterparts safe.

Likewise, an autonomous vehicle, such as a car, a factory cart, an aircraft, a boat, or any other moving machine or autonomous object, could come in close proximity to humans during malfunction or even in normal use. For example, autonomous cars driving in congested city streets may need to navigate crowds of humans who themselves are mingling among non-human objects, such as light poles, curbs, parked vehicles, trees, or other stationary inanimate objects. Even non-autonomous vehicles and robots, such as remotely piloted vehicles or human-operated vehicles, risk injuring nearby humans. For example, user negligence or user error can result in a vehicle striking a pedestrian crossing a street. For safety's sake, such complex navigation requires that the vehicle sense and avoid humans.

In general, as humans and machines continue to interact more frequently, the risk of injury to humans will increase unless sufficient safety measures are implemented. Some existing safety measures involve touch sensors, for example. Touch sensors are reactive systems, meaning they only activate after they have already made contact with someone or something. Similarly, existing safety measures may include torque sensors or power sensors, located at joints, that detect spikes in torque or power that are indicative of impact. Those touch and impact sensors may detect impact with an object, but they do not distinguish between an inanimate object and a human or other living being.

It is desirable to have a proactive safety approach to prevent contact from happening at all. Existing proactive systems use optical cameras, infrared (IR) sensors, or ultrasonic or laser range finders, for example, to proactively sense obstacles before impact. But such sensors generally do not distinguish between humans and non-humans or inanimate objects (such as a wall or another obstacle). Moreover, if an impact occurs, existing sensors may not provide information regarding the point of impact relative to the machine. Accordingly, such sensors may fail to protect a human in an effort to protect an inanimate object.

SUMMARY

A system for detecting a living being or animate object (such as a human or an animal or a part thereof) using electric fields may include a plurality of sensors, each sensor including a plurality of electrodes configured to generate an electric field. The system may include at least one amplifier connected to at least one of the electrodes. The system may also include a controller connected to at least one of the sensors, the controller being configured to operate the sensors to generate and analyze the electric fields. The system may also include a processor connected to the controller. The processor may be programmed with instructions that, when executed, interpret signals from the controller representative of a living being within the electric fields. The processor may output a signal representative of the presence or absence of a living being within the electric fields or representative of a distance between the sensor and the living being. The plurality of sensors may be grouped into arrays or array clusters and they may be attached to a rigid or flexible substrate. The sensors on the substrate may form a skin that can be attached to another structure or object, such as a robot, a vehicle, or another moving object to sense the presence of a living being near the object. In some embodiments, the moving object may be configured to stop moving or to move to avoid the living being present in the electric field.

Other features and advantages will appear hereinafter. The features described above can be used separately or together, or in various combinations of one or more of them.

BRIEF DESCRIPTION OF THE DRAWINGS

In the drawings, wherein the same reference number indicates the same element throughout the views:

FIG. 1 illustrates an example of a single capacitive electric field sensor known in the prior art.

FIG. 2 illustrates a group or array of sensors in accordance with an embodiment of the present technology.

FIG. 3 illustrates an array cluster having a plurality of sensor arrays in accordance with an embodiment of the present technology.

FIG. 4 illustrates a schematic diagram of electronic components for processing signals from a plurality of sensors in accordance with an embodiment of the present technology.

FIG. 5 illustrates a robotic arm with electric field sensing according to an embodiment of the present technology.

FIG. 6 illustrates an automobile with electric field sensing according to another embodiment of the present technology.

FIG. 7 illustrates a brake pedal and an accelerator pedal implementing electric field sensing according to another embodiment of the present technology.

FIG. 8 illustrates a vehicle steering wheel with electric field sensing according to another embodiment of the present technology.

FIG. 9 illustrates a vehicle car door and car door frame with electric field sensing according to another embodiment of the present technology.

FIG. 10 illustrates a room equipped with electric field sensing according to another embodiment of the present technology.

DETAILED DESCRIPTION

The present technology is directed to human sensing using electric fields, and associated systems and methods. Various embodiments of the technology will now be described. The following description provides specific details for a thorough understanding and enabling description of these embodiments. One skilled in the art will understand, however, that the invention may be practiced without many of these details. Additionally, some well-known structures or functions, such as structures or functions common to capacitive electric field sensors, electronic components, wireless signal transmission, signal conditioning, robotics, and vehicle control, for example, may not be shown or described in detail so as to avoid unnecessarily obscuring the relevant description of the various embodiments. Accordingly, the technology may have other embodiments with additional elements or without several of the elements described below with reference to FIGS. 1-10, which illustrate examples of the technology.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this detailed description section.

Where the context permits, singular or plural terms may also include the plural or singular term, respectively. Moreover, unless the word "or" is expressly limited to mean only a single item exclusive from the other items in a list of two or more items, then the use of "or" in such a list is to be interpreted as including (a) any single item in the list, (b) all of the items in the list, or (c) any combination of items in the list. Further, unless otherwise specified, terms such as "attached" or "connected" are intended to include integral connections, as well as connections between physically separate components.

Specific details of several embodiments of the present technology are described herein with reference to detecting humans or human body parts. In other embodiments, the technology may be used to detect other living beings or parts of living beings, such as animals or other animate objects.

Sensing Human Presence with Electric Fields

FIG. 1 illustrates an example of a single capacitive electric field sensor 100 known to persons of ordinary skill in the art. Such sensors 100 include a transmitting electrode 105 and a plurality of receiving electrodes 110 (such as five receiving electrodes 110). The sensor 100 illustrated in FIG. 1 is only a representative example. The sensors may have various shapes and configurations of electrodes 105, 110 other than the sensors described herein. For example, the electrodes 105, 110 may be mounted together on a single circuit board or they may be mounted on separate circuit boards.

A controller known in the prior art, associated with the sensor 100, is configured to detect a change in the electric field corresponding to the presence of an object. Such a sensor 100 is known in the prior art for tracking positions or gestures of a user's hand to control a computer device. Known sensors 100 typically operate with relatively low power and may only be able to detect an object within a short range, such as a few centimeters.

The inventors have discovered that electric field sensing using this type of sensor 100 can be improved for detection over longer distances by amplifying the electrodes 105, 110. The inventors have also discovered that grouping electric field sensors allows for sensing within a relatively large area of space around the sensors, as will be described in further detail below.

Figure 2:
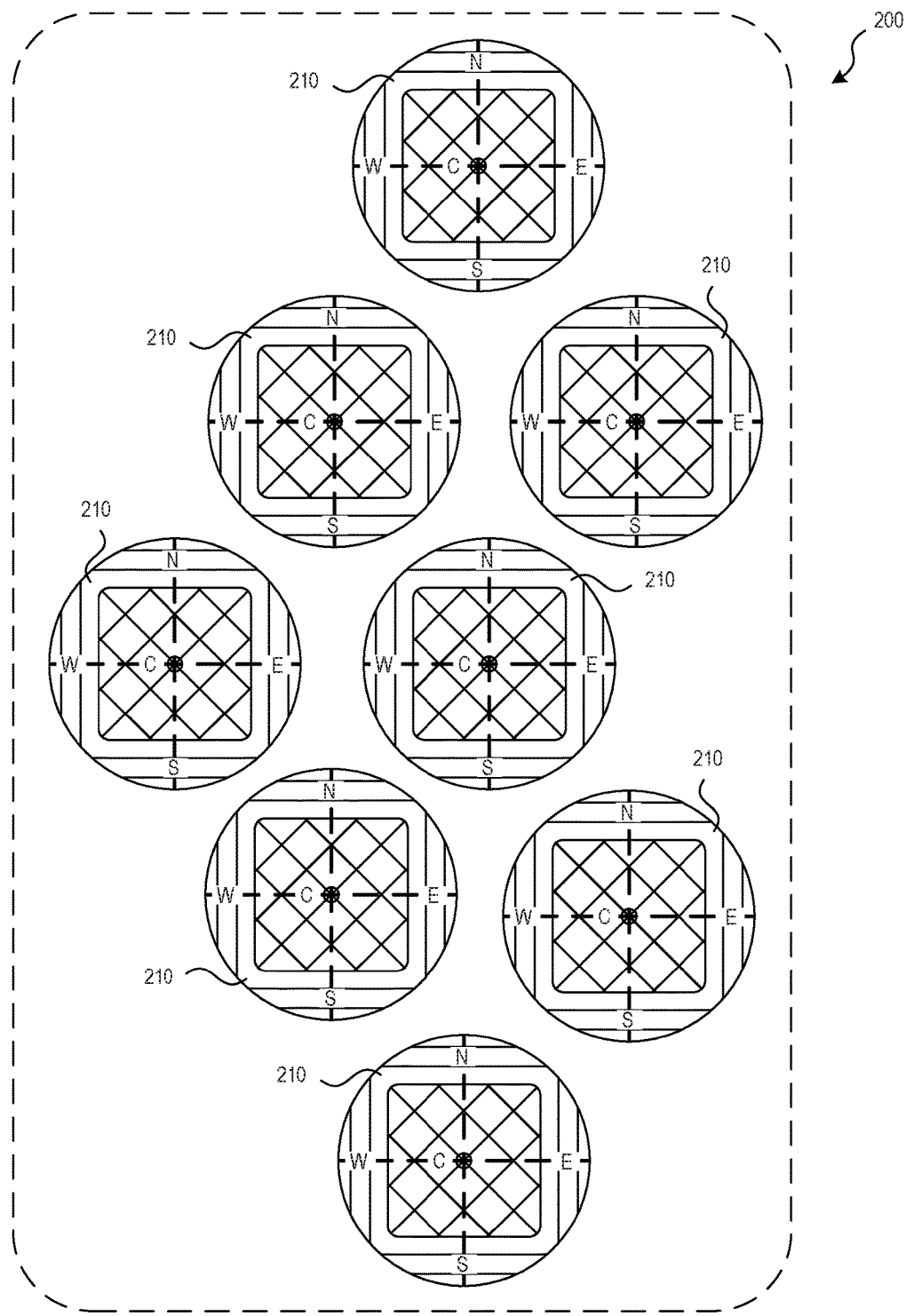

FIG. 2 illustrates a group or array 200 of electric field sensors 210 in accordance with an embodiment of the present technology. The array 200 may be formed with any suitable arrangement and number of sensors 210. For example, the array 200 may include between three and ten sensors 210. In a representative embodiment, as illustrated in FIG. 2, the array 200 may include eight sensors 210 arranged in an asymmetric shape, such as a w-shape or a partial diamond shape. Although the array 200 is illustrated in an asymmetric shape, it may be symmetric in some embodiments (for example, a square, triangle, or other multiple-sided shape). The array 200 may be formed in a nestable shape, such that it can nest or stack with other arrays 200.

The sensors 210 in the array 200 may be similar to the sensors 100 illustrated and described above with respect to FIG. 1, but the electrodes or the signals associated with the electrodes in the sensors 210 may be amplified as further described below. In some embodiments, the sensors 210 may be different from the sensors 100 described with respect to FIG. 1. Any suitable number of transmitting or receiving electrodes may be used in various embodiments. For example, some embodiments of the present technology may need only to sense the presence or absence of an object within the electric field, therefore fewer electrodes may be used. Accordingly, it is understood that the sensor 210 may be any suitable electric field sensor with any suitable number of electrodes and any suitable level of power, and it may be any suitable size, depending on application, power availability, desired sensitivity, and other factors.

Figure 3:
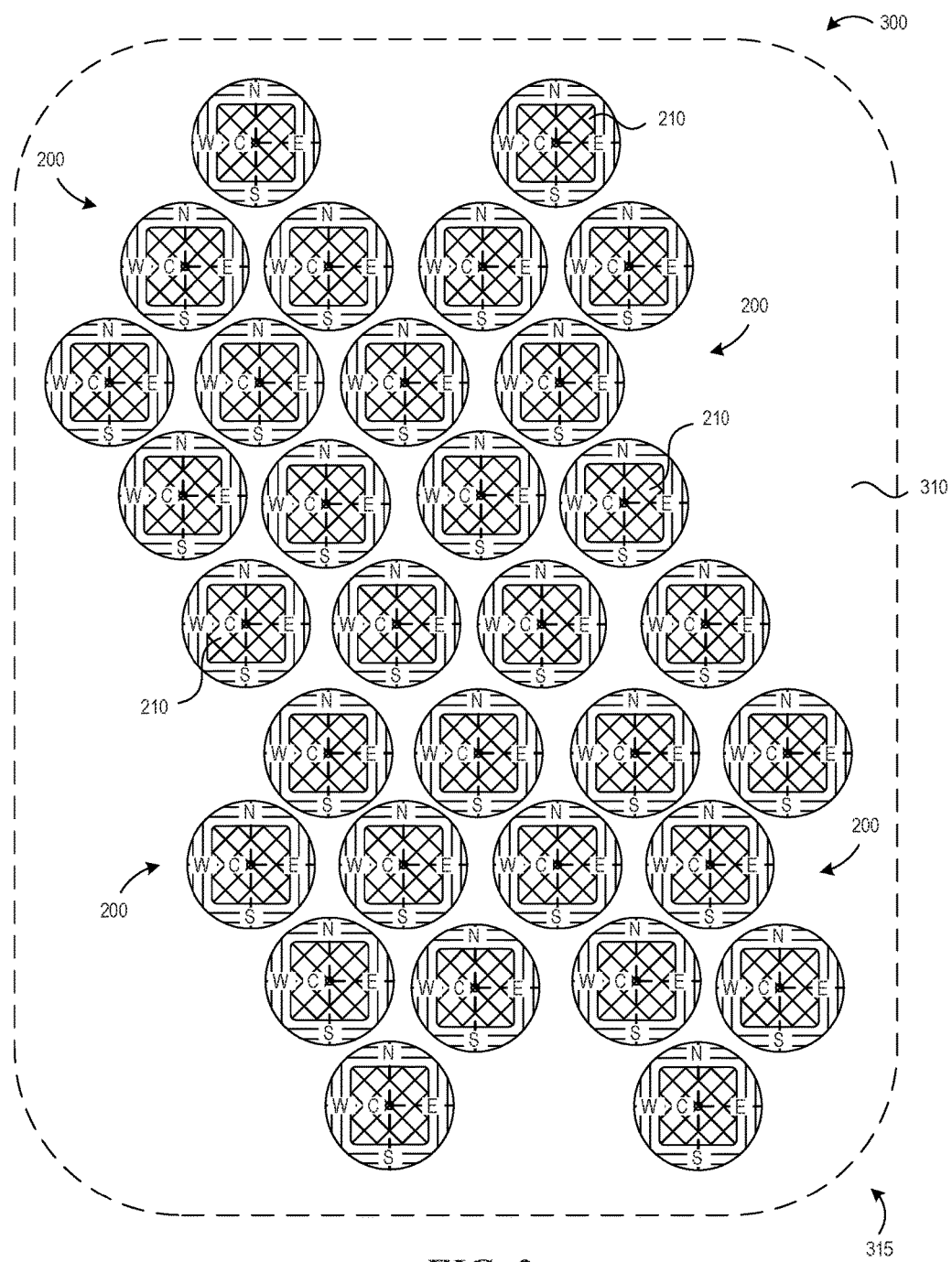

FIG. 3 illustrates an array cluster 300 in accordance with an embodiment of the present technology. The array cluster 300 includes a plurality of arrays 200. For example, an array cluster 300 may include between two and eight arrays 200, or even more or far more arrays 200. In the representative embodiment illustrated in FIG. 3, the array cluster 300 includes four arrays 200 nested together. The array cluster 300 may itself be configured to be nestable or stackable with other array clusters 300. Among the clusters 300 or arrays 200, the sensors 210 may be suitably spaced to avoid interfering with one another. For example, the sensors 210 may be spaced apart to avoid overlapping electrical fields between adjacent sensors 210.

The inventors discovered that when sensors 210 are arranged in arrays 200 or array clusters 300, or otherwise grouped together, the sensors 210 can form part of a panel or skin for detecting the presence of humans or for differentiating between humans and inanimate objects. For example, the sensors 210 detect more of a change in their electric fields for water-based objects than for plastic, metal, or other inorganic objects. In a particular example, the sensors 210 detect more of a change in the electric field for human body parts, such as a hand, than in other objects like a light pole or a box.

Accordingly, in one embodiment of the present technology, the arrays 200 or array clusters 300 may be mounted to, embedded in, or otherwise attached to a substrate 310 to form a rigid or flexible skin 315 or a portion thereof. In some embodiments, the substrate 310 may be rigid or semi-rigid and it may include a printed circuit board (PCB), fibrous composite (such as carbon fiber composite, fiberglass composite, or other fibrous composite), plastic, or other suitable materials for mounting or embedding the sensors 210. In other embodiments, the substrate 310 may be flexible and it may include synthetic or natural cloth, rubber, thin plastic, or other suitable flexible materials for mounting or embedding the sensors 210. A flexible substrate 310 may provide flexibility for the skin 315, allowing the arrays 200 or array clusters 300 to be placed onto a variety of surfaces, such as flexible surfaces or contoured surfaces. If a flexible substrate 310 is used, suitable flexible connectors known in the art can be used to accommodate movement among constituent sensors 210, arrays 200, or array clusters 300 and the corresponding signal processing hardware for the sensors 210 (described below).

The skin 315 may optionally include signal processing hardware for operating each sensor 210 and analyzing changes in the corresponding electric field. In some embodiments, such hardware is integrated into (such as embedded into) the skin 315 itself, while in other embodiments, the signal processing hardware may be housed outside of the skin 315. In some embodiments, signal processing hardware for operating the sensors 210 is independent of other main computing equipment to reduce the load on the associated main computing equipment. For example, the skin 315 (and its sensors 210) may be configured to output alerts regarding the presence of a human, rather than placing the computational burden required to determine human presence on another system, such as on a computer operating a robot or vehicle having the skin 315.

Figure 4:
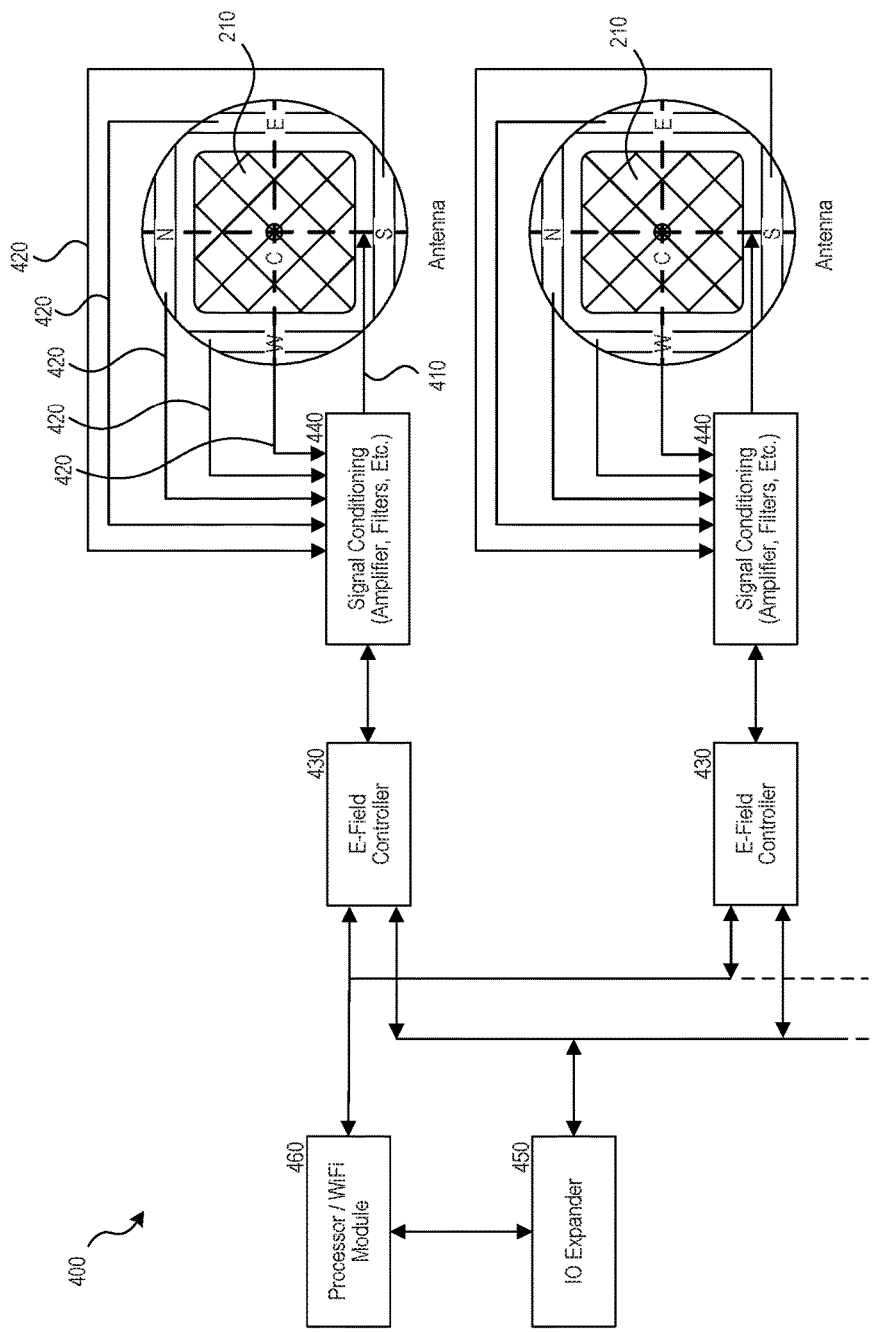

FIG. 4 illustrates a schematic diagram 400 of electronic components for processing signals from a plurality of sensors 210 in accordance with embodiments of the present technology. The sensors 210 operate by transmitting and receiving an electric field using electrodes, as further described above. The electrodes in the sensors 210 are connected to electric field sensor controllers 430 via at least one transmit channel 410 and at least one receive channel 420 (four receive channels 420 are shown by way of example). The arrangement of the electrodes in the sensors 210 allows the electric field controller 430 to determine the presence or absence of an object in the electric field. In some embodiments, the controller may operate the sensor(s) 210 to generate and analyze the electric fields to determine a distance of the object from the sensor 210, or to determine a three-dimensional position of the object in the electric fields.

The inventors discovered that amplifying and conditioning the signals in the transmit and receive channels 410, 420 increases the range at which a sensor 210 can detect the presence or absence of objects. In an embodiment of the present technology, a signal conditioner or amplifier system 440 (having one or more amplifiers and, optionally, signal conditioning circuitry) may be connected to each sensor 210 between the electric field sensor controller 430 and the sensor 210 to amplify the signals on the transmit and receive channels 410, 420, thereby boosting the effective measurement and sensing range of the sensor 210. In some embodiments of the present technology, the range at which a sensor 210 can detect an object is increased to eight inches or more. In some embodiments, the range may be one meter or more, and in some embodiments, the range may be three meters or more. The signal conditioner or amplifier system 440 may include high-speed MOSFET drivers capable of providing over one amp of peak current. The inverting or non-inverting outputs of the amplifier system 440 are directly controlled from the transmitting output of the electric field sensor controllers 430.

The sensors 210 may be any suitable electric field sensor, such as the electric field sensor 100 illustrated in FIG. 1, or another electric field sensor. Accordingly, although one transmit channel 410 and five receive channels 420 are illustrated, any other suitable number of transmit channels 410 and receive channels 420 may be used in various embodiments of the present technology. In addition, although only two sensors 210 are illustrated in FIG. 4, the circuitry and components may be duplicated or expanded to operate more sensors 210, such as one or more arrays 200 or clusters 300 of sensors 210. In some embodiments, a single signal conditioner or amplifier system 440 may be used for multiple sensors 210, while in other embodiments, each sensor 210 may have its own dedicated signal conditioner or amplifier system 440.

An input/output expander ("I/O expander") 450 in the system facilitates control of multiple electric field sensor controllers 430 and sensors 210, such as in an array 200 or a cluster 300 of sensors 210. The I/O expander 450 may follow commands from the processor module (described below) and operate to control or maintain states of each individual sensor 210 (for example, on, off, or pulse width modulation ("PWM")). The I/O expander may include a built-in clock, and may run continuously while powered on to change or hold states of each individual sensor 210 or groups of sensors 210 (for example, arrays 200 or array clusters 300 of sensors 210) as directed by a processor module 460, which is described in additional detail below. The I/O expander 450 increases the number of sensors 210 the processor module 460 can control or receive data from. In some embodiments, the I/O expander 450 may be based on "I²C" or SPI-controlled pulse width modulation and general purpose input-output signals.

In some embodiments, the I/O expander 450 may have adjustable pulse width modulation within a range of 25 hertz to 1.5 kilohertz, and it may have 12-bit resolution for each output connection. In other embodiments, the I/O expander 450 may have other suitable PWM ranges or resolutions for output connections. For example, higher resolution provides for more discrete PWM steps, which can be used to provide finer adjustment to various signals, such as signals associated with the sensors 210 or signals for controlling intensity of any feedback systems associated with a system using the sensors 210 (such as lights, buzzers, vibration motors, or other devices for visual, auditory, or haptic feedback). In a representative embodiment, an I/O expander 450 with 12-bit resolution may provide 4096 discrete PWM steps. Each output connection may be configurable as open-drain or push-pull. In some embodiments, the I/O expander may be an off-the-shelf component. In other embodiments, the I/O expander may be a custom component.

The processor module 460 may include a CPU, such as a low-power 32-bit CPU or other suitable processor unit, to serve as the application processor. The application to operate the sensors 210 may be firmware on the processor module 460. In some embodiments, the application may be software on a removable medium. In a particular embodiment, the processor module 460 includes wireless communication capabilities, such as WiFi, 802.11 b/g/n media access control (MAC), or other suitable wireless communications protocols. In some embodiments, the processor module 460 may support software access point (AP) protocols, integrated TCP/IP stack, and physical layer specifications. In other embodiments, the processor module 460 may include wired communications components. In some embodiments, the processor module 460 may further include an onboard battery and related charging equipment, such as a lithium polymer battery and associated charging circuitry. In some embodiments, the battery may charge via USB, via wireless or inductive charging (for example, using the QI interface standard), or by other suitable charging arrangements. Although a small dedicated CPU is illustrated as the processor module 460, the processor module 460 may be a general purpose computer or it may otherwise perform additional functions other than those described herein.

In some embodiments of the present technology, most or even all processing of data 210 from the sensors may be performed locally on the processor module 460. For example, in some embodiments, the processor module 460 may output a constant or periodic signal representative of the absence of a human or human body part in the electric field until a sensor 210 detects a human or human body part. In other embodiments, the processor module 460 may be queried to determine the presence of a human or human body part. When a human or human body part is present, the signal processing hardware (such as the hardware depicted in FIG. 4) may output a flag, such as an on or off signal, notifying a main computing device (such as a computer in a robot or automobile) that a human is present.

In other embodiments, the processor module 460 may be programmed with instructions that, when executed, determine a distance from the sensor 210 to the human or human body part within the electric field and it may output the distance or a signal representative of the distance. The processor module 460 may output other signals or data. In a representative embodiment, the processor module 460 outputs only basic data representative of the presence or absence of an object in the electric field of one or more of the sensors 210, such that processing external to the processor module 460 is minimized. Such an embodiment improves scalability of the present technology and implementation into other systems. For example, such a simple output reduces processing load on a robot or vehicle, or on the robot or vehicle control computer.

In general, the processor 460 may be programmed with instructions that, when executed, interpret signals from the controller 430 representative of a living being, such as a human, animal, or other animate object within the electric fields. The processor may further be programmed to determine a distance or a three-dimensional position of a living being or other object relative to the sensor(s) 210 or the object upon which the sensor(s) 210 or the skin 315 are mounted.

Applications

The inventors discovered numerous applications for the electric field sensor arrays 200, array clusters 300, or flexible skin 315 for improving safety and usability of machine systems, including autonomous and piloted systems.

Figure 5:
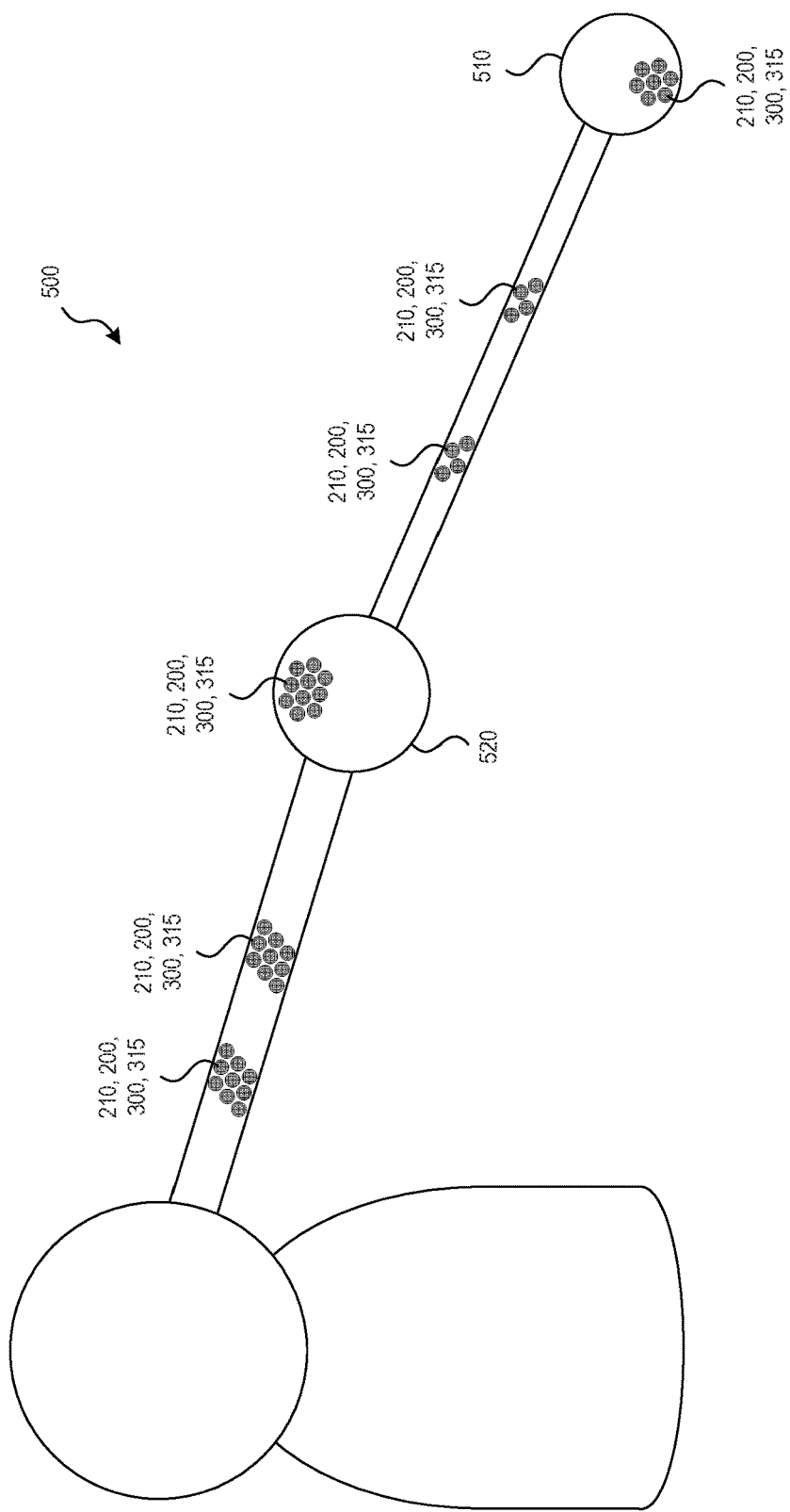

For example, FIG. 5 illustrates a robotic arm 500 with electric field sensing according to an embodiment of the present technology. The robotic arm 500 may include one or more arrays 200 of sensors 210 or array clusters 300 of sensors 210 positioned on various locations on the arm 500. The sensors 210 may be part of a skin placed on or forming an outer surface of the arm 500 (such as the skin 315 described above). For example, one or more sensors 210, arrays 200, array clusters 300, or skins 315 may be positioned on an end effector 510 to detect a human body part or other object while the robotic arm 500 is moving around and operating. Similarly, one or more sensors 210, arrays 200, array clusters 300, or skins 315 may be positioned on a joint 520 of the arm 500 to detect a human or other object. In other embodiments, sensors 210, arrays 200, array clusters 300, or skins 315 may be placed in any suitable location for detecting a human or other object.

Embodiments of the present technology may improve safety for humans working in the vicinity of the arm 500. For example, the sensors 210 may detect a human before impact and the processor or processors (460, described above) may output a signal indicating human presence. The robotic arm 500 control computer may then stop or reverse the movement of the arm to avoid contact with the human or other object. Embodiments of the present technology are not limited to robotic arms 500, and may be used on robotic legs or anywhere on a robot, including a humanoid robot, for example.

Figure 6:
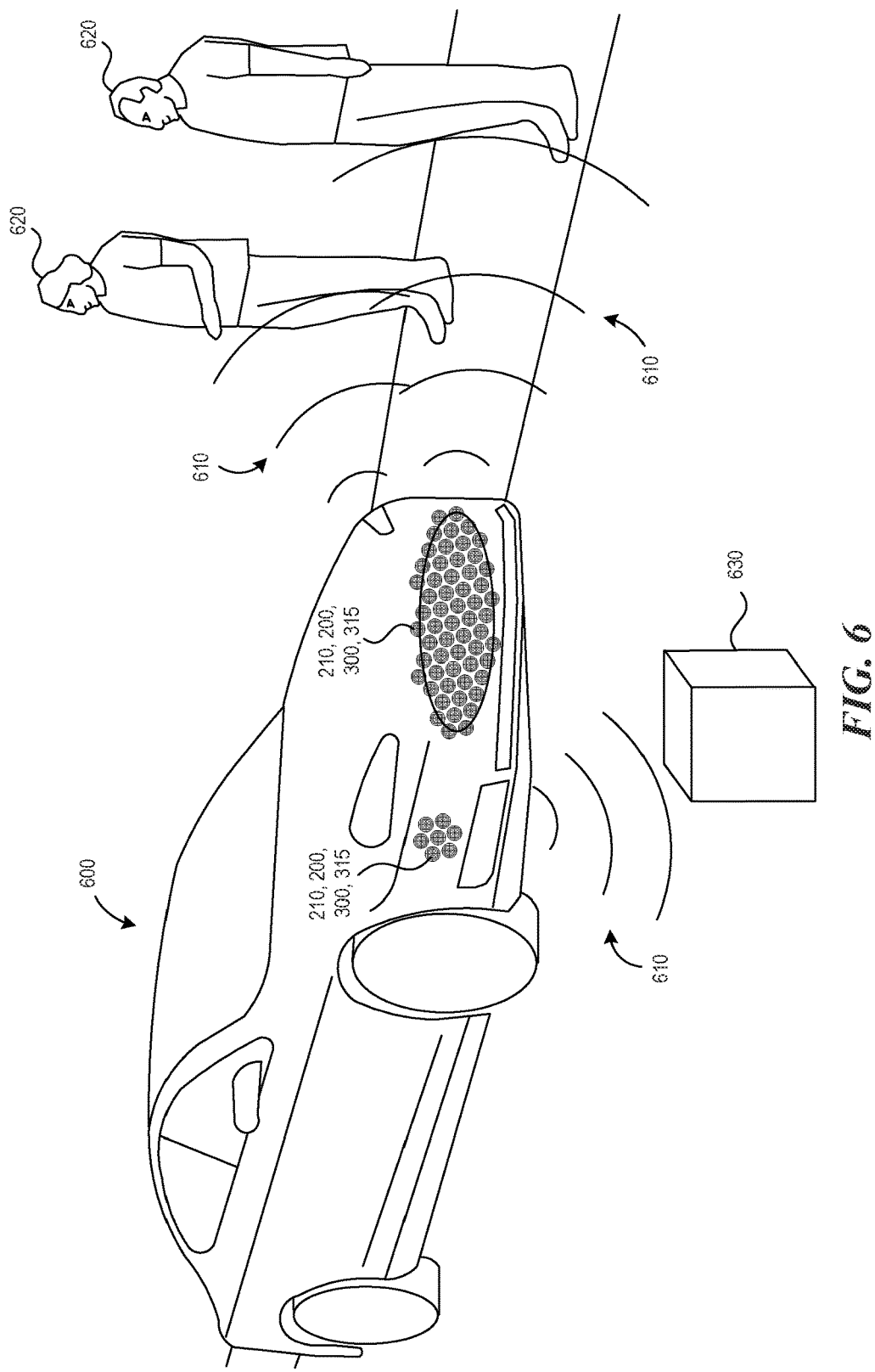

FIG. 6 illustrates an automobile or car 600 with electric field sensing according to another embodiment of the present technology. The car 600 may have one or more arrays 200 of sensors 210 or array clusters 300 of sensors 210 positioned around various locations on the car 600. The sensors 210 may be part of a skin placed upon or forming an outer surface of the car 600 (such as the skin 315 described above). For example, one or more sensors 210, arrays 200, array clusters 300, or skins 315 may be positioned on the front or front quarter panel of the car 600. The electric fields 610 may detect humans 620 or other objects 630.

In a representative embodiment, the sensors 210 and associated hardware may distinguish between humans 620 and other objects 630, as described above. A controller in the car 600 may use information about whether there is a human 620 or an inanimate object 630 in the electric field to determine a path to avoid the humans 620 and the object 630. In one embodiment, the car 600 may be configured to stop, swerve, or otherwise avoid the humans 620 even if it may hit the inanimate object 630. For example, in an autonomous car, the sensors 210 and associated hardware may provide sense-and-avoid technology to improve safety for pedestrians (such as the humans 620) or passengers. In some embodiments, the inanimate object 630 may include street light poles, parked cars, trash cans, or other objects found alongside roadways or streets. Although a car is illustrated, in other embodiments, the technology may be implemented on other moving devices or vehicles.

Figure 7:
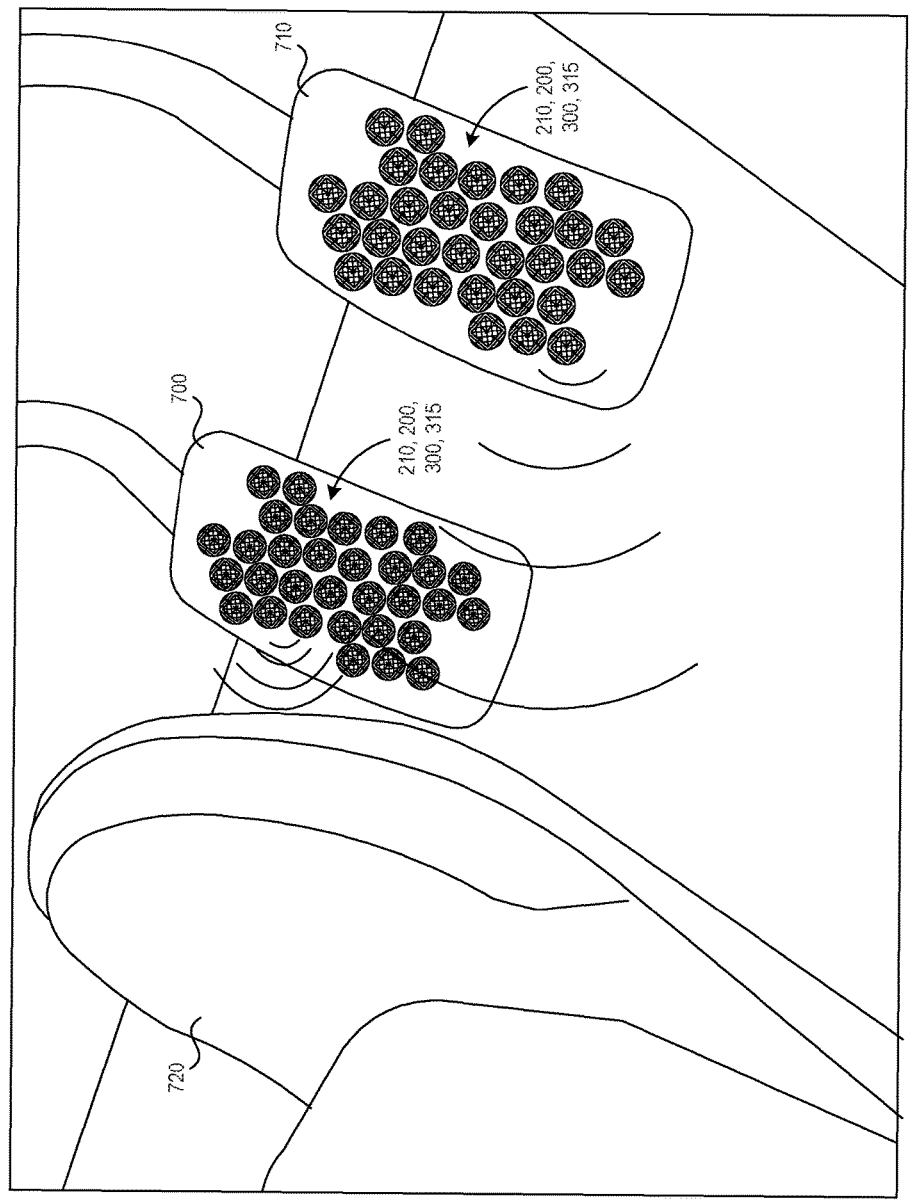

FIG. 7 illustrates a brake pedal 700 and an accelerator pedal 710 implementing electric field sensing according to another embodiment of the present technology. The brake pedal 700 or the accelerator pedal 710 of an automobile may include one or more arrays 200 of sensors 210 or array clusters 300 of sensors 210. The sensors 210 may be part of a skin placed on or forming part of the pedals 700, 710 (such as the skin 315 described above). The sensors 210 may detect a human foot 720 in close proximity to the pedals 700, 710. For example, if the foot is near the brake pedal 700, the brake pedal or brake may activate prior to contact by the foot 720 to augment a driver's reaction time during a braking event. Likewise, in some embodiments, sensors 210 in the accelerator pedal 710 may detect the foot 720 to begin acceleration before the foot 720 contacts the pedal 710.

Figure 8:
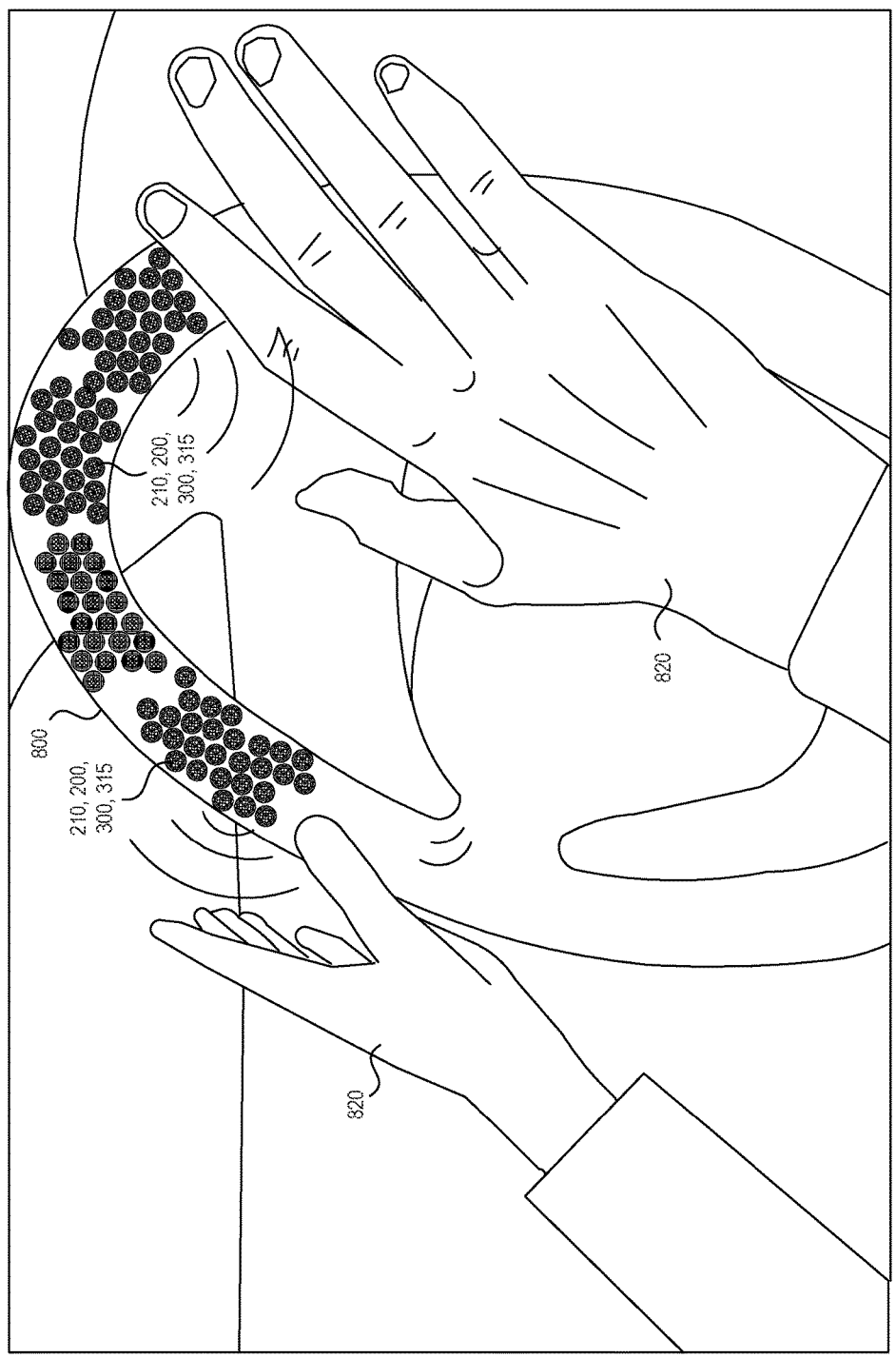

FIG. 8 illustrates a vehicle steering wheel 800 with electric field sensing according to another embodiment of the present technology. The steering wheel 800 may include one or more arrays 200 of sensors 210 or array clusters 300 of sensors 210. The sensors 210 may be part of a skin placed on or forming a part of the wheel 800 (such as the skin 315 described above). In such an embodiment, the sensors 210 and associated electronic equipment described herein may alert a user or a vehicle computer that the user has taken his or her hands 820 away from the steering wheel 800. Although a steering wheel 800 is illustrated, in other embodiments, the technology may be used in other controls, such as airplane controls, boat controls, train controls, or other vehicle or industrial controls.

In other embodiments, the technology may be used to detect a person's hand near an emergency brake to augment a driver's reaction time during an emergency braking event. In some embodiments, the technology may be used to detect a person sitting on the seat, such as a person who may otherwise fail to trigger a weight sensor to activate or deactivate an airbag or seatbelt alarm.

Figure 9:
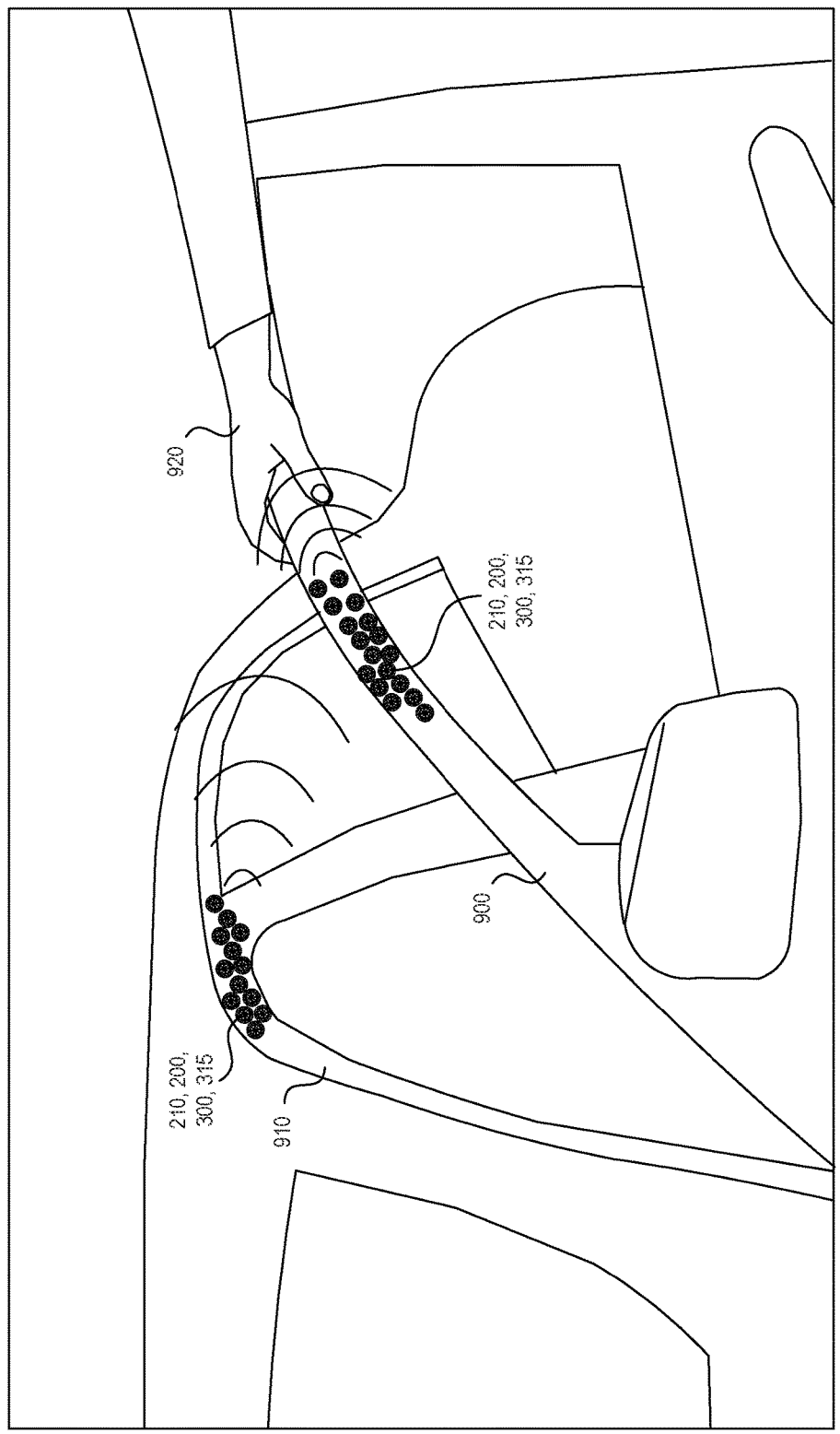

FIG. 9 illustrates a vehicle car door 900 and car door frame 910 with electric field sensing according to another embodiment of the present technology. The door 900 or the door frame 910 may include one or more arrays 200 of sensors 210 or array clusters 300 of sensors 210. The sensors 210 may be part of a skin placed on or forming part of the door 900 or frame 910 (such as the skin 315 described above). In such an embodiment, the sensors 210 and associated electronic equipment described herein may signal when a user's hand 920 or other object is between the door 900 and door frame 910. Upon such a signal, the car door 900 may be prevented from closing. For example, if the car door 900 is an automatically closing door, the automatic closing operation can be stopped or reversed until the user's hand 920 or other object is removed.

In some embodiments of the present technology, the sensors 210 and associated electronic equipment distinguish between human body parts and non-human parts, as described in additional detail above. Accordingly, the door may be programmed to continue attempting to close unless the sensors 210 indicate the presence of a human. Such an arrangement may help avoid false positives that would otherwise cause the door 900 to stop or reverse even though no person is in the path of the door 900. Embodiments of the present technology may also be implemented in minivans, supercars, or other vehicles with doors, or in non-vehicle doors, such as doors in homes or businesses.

Figure 10:
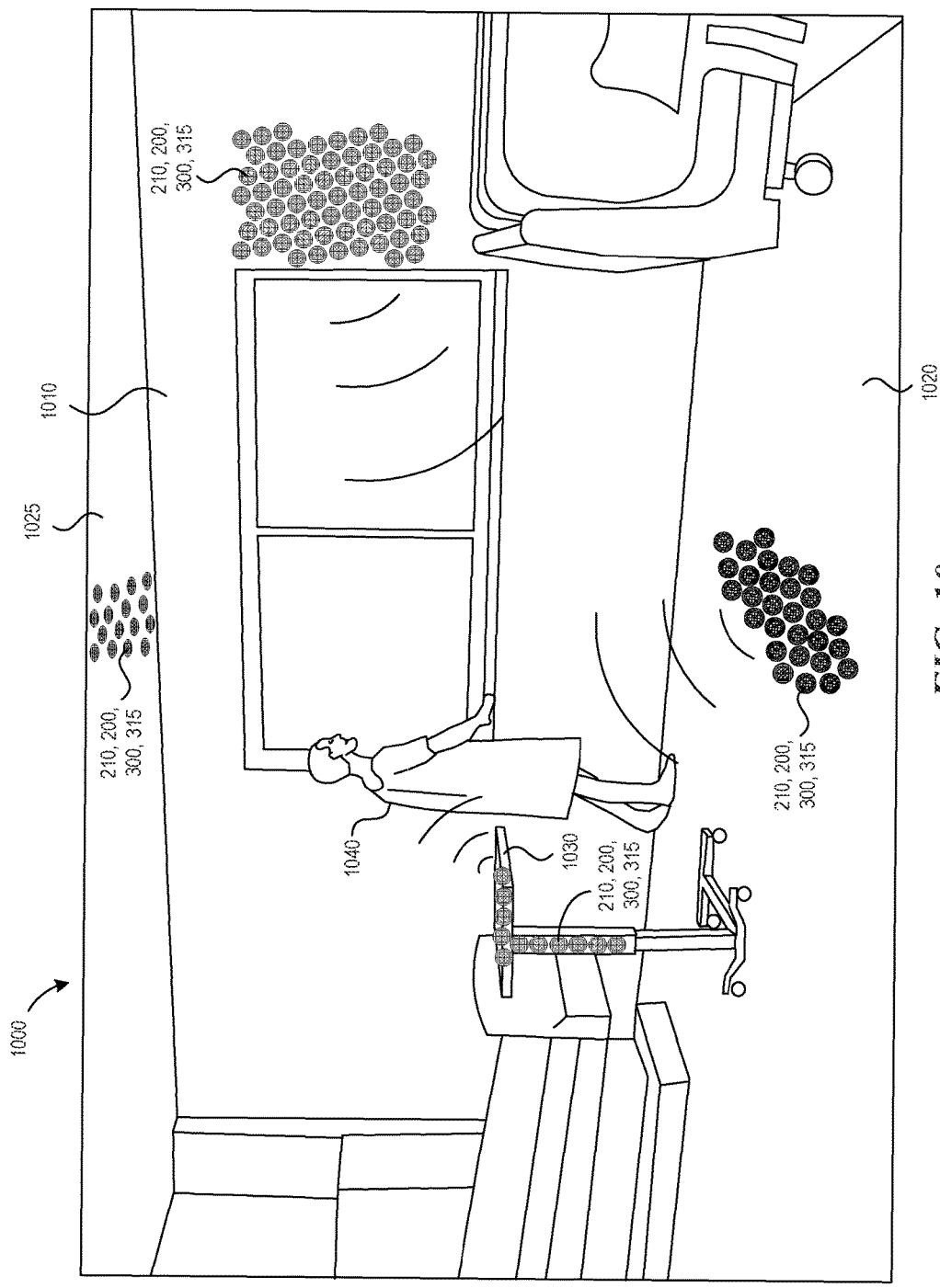

FIG. 10 illustrates a room 1000 equipped with electronic field sensing according to another embodiment of the present technology. The illustrated room 1000 is a hospital room with hospital equipment, but other rooms and equipment or objects in a room are contemplated in various embodiments of the present technology. The room 1000 may include, for example, a wall 1010, a floor 1020, a ceiling 1025, and a furnishing or object 1030, such as a cart or a tray. One or more of the wall 1010, the floor 1020, the ceiling 1025, or the object 1030 may include one or more arrays 200 of sensors 210 or array clusters 300 of sensors 210. The sensors 210 may be part of a skin placed on or forming part of the wall, floor, ceiling, or object (such as the skin 315 described above). In such embodiments, the wall 1010, the floor 1020, the ceiling 1025, or a furnishing or object 1030 may detect a human 1040 or the activities or motion of the human 1040 within the room. For example, the sensors 210 and associated electronic equipment described herein may assist hospitals with monitoring patient activity or turn on or off certain equipment (such as lighting) depending on the presence or activity of the human 1040.

In some embodiments, the present technology may be applied to home use (for example, monitoring a child or loved one, or for security purposes). In general, embodiments of the present technology may be implemented in homes or businesses to monitor the presence or absence of, or the activities of, a human. In other embodiments, the arrays 200 of sensors 210 or array clusters 300 of sensors 210 may be implemented in factories or other environments to detect the presence of humans and to accordingly activate or deactivate equipment such as lighting, climate control, or machinery.

In further embodiments, arrays 200 of sensors 210, array clusters 300 of sensors 210, or a skin 315 may be implemented in prosthetics, for example, to allow a wearer of the prosthetic to sense objects in the vicinity similar to hairs or nerves on a non-prosthetic wearer's skin. In another embodiment, wearable devices such as clothing, VR goggles, or headphones may include arrays 200 of sensors 210, array clusters 300 of sensors 210, or a skin 315 to detect a person to enable operation (as opposed to operation while a user is not wearing the device).

In another example, embodiments of the present technology can be used in disaster relief efforts. For example, sensors 210, arrays 200, array clusters 300, or the skin 315 can be placed onto extendable implements for sweeping rubble, avalanche piles, mud piles, or other areas under which a person may be trapped after a disaster.

In various embodiments, the sensors 210 or associated electronic equipment may characterize the detection of a human or object by levels of risk. For example, a plurality of distance ranges from the sensors 210 may define levels of risk. Autonomous or piloted devices disclosed herein may be configured to react differently depending on the level of risk, or the zone or range in which a human or object is detected. In some embodiments, the disturbance in the electric field may be located to provide a distance or position of the human or object in the field relative to one or more of the sensors 210. Awareness of such a distance or three-dimensional position further enhances the ability of a device or machine using the sensors to react appropriately (for example, by moving away from the human or object).

From the foregoing, it will be appreciated that specific embodiments of the disclosed technology have been described for purposes of illustration, but that various modifications may be made without deviating from the technology, and elements of certain embodiments may be interchanged with those of other embodiments, and that some embodiments may omit some elements. For example, in some embodiments, sensors and associated electronic equipment may be used to detect living things, such as humans, animals, or otherwise. Although various embodiments disclosed herein may utilize particular shapes of sensors or geometric arrangements of sensors, such shapes or arrangements are not necessary in every embodiment, and may be omitted or combined in various embodiments. For example, in some embodiments, groups of electric field sensors may be combined together to form a single large sensor or they may act independently as multiple small electric field sensors.

Further, while advantages associated with certain embodiments of the disclosed technology have been described in the context of those embodiments, other embodiments may also exhibit these advantages, and not all embodiments need necessarily exhibit such advantages to fall within the scope of the technology. Accordingly, the disclosure and associated technology may encompass other embodiments not expressly shown or described herein, and the invention is not limited except as by the appended claims.

What is claimed is:

1. A system for detecting a living being using electric fields, the system comprising:
    a plurality of sensors, each sensor including at least one transmitting electrode configured to generate an electric field and a plurality of receiving electrodes configured to receive an electric field;
    at least one amplifier connected to the at least one transmitting electrode and configured to increase a range of the electric field;
    a controller connected to at least one of the sensors, the controller configured to operate the sensors to generate and analyze the electric fields; and
    a processor connected to the controller, the processor programmed with instructions that, when executed, interpret signals from the controller representative of a living being within the electric fields;
    wherein the plurality of sensors are attached to a substrate and arranged in an asymmetric array.
2. The system of claim 1 wherein the substrate is flexible.

3. The system of claim 1 wherein the at least one amplifier, the controller, and the processor are attached to the substrate.

4. The system of claim 1 wherein the processor outputs a signal representative of the presence or absence of a living being within the electric field.

5. The system of claim 1 wherein the processor is further programmed with instructions that, when executed:
   determine a distance between a living being within the electric fields and the sensors; and
   output a signal representative of the distance.

6. The system of claim 1 wherein the substrate is attached to a robot or a vehicle.

7. A system for sensing a human and avoiding physical contact with the human, the system comprising:
   a moving object near the human;
   a plurality of electrical field sensors attached to the moving object, each electrical field sensor comprising at least one transmitting electrode configured to produce an electrical field and a plurality of receiving electrodes configured to receive the electrical field;
   an amplifier connected to each transmitting electrode and configured to increase a range of each electrical field; and
   a processor programmed with instructions that, when executed, detect the disturbance of the electrical field and output a signal representative of a presence or absence of the human within the electrical field; wherein
   the electrical field sensors and the processor are embedded in a substrate attached to the moving object; and
   the moving object is configured to stop moving or to move to avoid the human in response to a signal from the processor representative of the human being present in the electrical field.

8. The system of claim 7 wherein the processor is further programmed with instructions that, when executed, determine whether an object in the electrical field is an animate object or an inanimate object.

9. The system of claim 7 wherein the moving object is an automobile.

10. The system of claim 9 wherein the automobile is configured to steer or brake to avoid the human.

11. The system of claim 7 wherein the moving object is a robot.

12. The system of claim 7 wherein the moving object is a door.

13. A method of controlling an autonomous device to avoid physical contact with a living being, the method comprising:
   operating an autonomous device;
   producing a plurality of electrical fields using a plurality of electrical field sensors, each electrical field sensor including at least one transmitting electrode and a plurality of receiving electrodes;
   detecting, with one or more of the receiving electrodes, a disturbance of one or more of the electrical fields caused by an object in the one or more of the electrical fields;
   analyzing the disturbance to determine whether the object is inanimate or a living being; and
   in response to determining the object is a living being, controlling the autonomous device to stop or move away from the living being.

14. The method of claim 13 wherein the autonomous device is an automobile.

15. The method of claim 13 wherein the autonomous device is a robot.

16. The method of claim 13 wherein the autonomous device is a door.

17. The method of claim 13 wherein producing a plurality of electrical fields comprises amplifying the electrical fields using one or more amplifiers.

* * * * *